United States Patent
Hourai et al.

(10) Patent No.: US 7,364,618 B2
(45) Date of Patent: Apr. 29, 2008

(54) SILICON WAFER, METHOD FOR MANUFACTURING THE SAME AND METHOD FOR GROWING SILICON SINGLE CRYSTALS

(75) Inventors: Masataka Hourai, Saga (JP); Wataru Sugimura, Saga (JP); Toshiaki Ono, Saga (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 10/587,039

(22) PCT Filed: Aug. 24, 2005

(86) PCT No.: PCT/JP2005/015346

§ 371 (c)(1),
(2), (4) Date: Jul. 24, 2006

(87) PCT Pub. No.: WO2006/022296

PCT Pub. Date: Mar. 2, 2006

(65) Prior Publication Data

US 2007/0157870 A1  Jul. 12, 2007

(30) Foreign Application Priority Data

Aug. 25, 2004 (JP) ............................ 2004-246017
Jun. 2, 2005 (JP) ............................ 2005-163152
Aug. 22, 2005 (JP) ............................ 2005-239529

(51) Int. Cl.
C30B 15/20 (2006.01)
C01B 33/26 (2006.01)

(52) U.S. Cl. ............................ 117/20; 117/13; 117/19; 423/328.2

(58) Field of Classification Search ................. 117/13, 117/19, 20; 423/328.2
See application file for complete search history.

(56) References Cited

U.S. PATENT DOCUMENTS

2002/0081440 A1  6/2002  Murakami et al.

(Continued)

FOREIGN PATENT DOCUMENTS

JP  11-189495 A  7/1999

(Continued)

OTHER PUBLICATIONS

Masaahi Suezawa, "Hydrogen and Crystal Technology—controlling of ultimately light element," 110th Workshop Text, JPNSoc. Appl.Phys., Div. Science and Technology of Crystals, p. 11-18, (Jun. 3, 1999).

(Continued)

*Primary Examiner*—Felisa Hiteshew
(74) *Attorney, Agent, or Firm*—Pillsbury Winthrop Shaw Pittman, LLP

(57) ABSTRACT

This silicon wafer is obtained from a silicon single crystal grown by the CZ method in a hydrogen-containing inert gas atmosphere, and is a completely grown-in defect-free wafer containing no COPs or dislocation clusters throughout the wafer in the thickness and radial directions thereof, and all the portions consist essentially of an interstitial rich region. This method for growing silicon single crystals includes pulling a silicon single crystal in a hydrogen-containing inert gas atmosphere so as to expand the range of the pull rate for the PI region, wherein the pulling of the silicon single crystal is conducted at a pull rate within this expanded range of the pull rate for the PI region so as to grow a body portion that is an interstitial rich region.

5 Claims, 12 Drawing Sheets

U.S. PATENT DOCUMENTS

| | | |
|---|---|---|
| 2002/0139298 A1 | 10/2002 | Okui et al. |
| 2003/0022003 A1 | 1/2003 | Park |

FOREIGN PATENT DOCUMENTS

| | | |
|---|---|---|
| JP | 2000-281491 A | 10/2000 |
| JP | 2001-151597 | 6/2001 |
| JP | 2001-220289 | 8/2001 |
| JP | 2001-335396 | 12/2001 |
| JP | 2002-187794 | 7/2002 |
| JP | 2004-182525 | 7/2004 |
| KR | 2001-0090002 | 10/2001 |
| TW | 486749 | 5/2002 |

OTHER PUBLICATIONS

E. Iino et al., "Cavaties owing to Hydrogen in Si single crystals grown by continuously charging CZ method," Materials Science and Engineering, p. 146-149, B6 (1996).

T.H. Wang, et al., "Charge carrier recombination centers in high-purity, dislocation-free, float-zoned silicone due to growth-induced microdefects," Jounal of Crystal Growth, p. 155-161, vol. 109 (1991).

Yoshimitsu Sugita, "X-Ray Observations of Defect Structures in Silicone Crystal," Japanes Journal of Applied Physics, vol. 4 (No. 12), p. 962-972, (Jul. 9, 1965).

Office Action dated May 2, 2007 on the counterpart Taiwanese Patent Application No. 094128981.

SILICON WAFER, METHOD FOR MANUFACTURING THE SAME AND METHOD FOR GROWING SILICON SINGLE CRYSTALS

TECHNICAL FIELD

The present invention relates to silicon wafers and a method for manufacturing the same, from which semiconductor devices can be fabricated, and also relates to a method for growing silicon single crystals from which silicon wafers can be prepared. More particularly, the present invention relates to techniques suitable for use in the preparation of what are known as grown-in defect-free wafers.

This U.S. National Phase Application claims priority from International Patent No. PCT/JP2005/015346, filed on Aug. 24, 2005 which claims priority to Japanese Patent Application No.2004-246017, filed on Aug. 25, 2004, Japanese Patent Application No. 2005-163 152, filed on Jun. 2, 2005, and Japanese Patent Application No. 2005-239529, filed on Aug. 22, 2005, the contents of which are incorporated herein by reference.

BACKGROUND ART

The rotational pulling process known as the Czochralski (CZ) method is representative of the methods for manufacturing silicon single crystals used to prepare silicon wafers. In the production of a silicon single crystal by the CZ method, as is commonly known, a seed crystal is immersed in a silicon melt that has been prepared in a quartz crucible, then is pulled upward while the crucible and the seed crystal are rotated. Thereby, a silicon single crystal is grown downward from the seed crystal.

In a silicon single crystal produced in this way, various grown-in defects are known to be formed which cause problems during device fabrication. Grown-in defects are generally of two types: dislocation clusters which arise in an interstitial rich region, and crystal originated particles (COPs) or voids which arise in a vacancy rich region. Between these two regions, there exists a ring-like oxygen-induced stacking fault (OSF) forming region. In addition, there are vacancy type and interstitial type grown-in defect-free regions. The typical defect distribution in the radial direction of the single crystal is described below while referring to FIG. 1.

A ring-like OSF-forming region exists at an intermediate position in the radial direction of the crystal. Inside the ring-like OSF-forming region, a COP or void-forming region is located, while intervening a defect-free region therebetween. Outside the ring-like OSF-forming region, a dislocation cluster-forming region is located, while intervening an oxygen precipitation accelerating region and an oxygen precipitation inhibiting region (Pi region) therebetween. The oxygen precipitation accelerating region is a vacancy type grown-in defect-free region which is a region free of vacancy type grown-in defect (PV region), and the oxygen precipitation inhibiting region is an interstitial type grown-in defect-free region which is a region free of interstitial type grown-in defects (PI region).

Such a defect distribution is known to be controlled by two factors. One is the crystal pull rate, and the other is the temperature distribution within the crystal just after solidification. The influence of the crystal pull rate is described below while referring to FIG. 2.

FIG. 2 shows the defect distribution in a longitudinal section view of a single crystal grown while gradually lowering the pull rate. At a rapid pull rate, the ring-like OSF-forming region is positioned at the outside edge of the crystal. Therefore, in wafers obtained from a single crystal grown at a high pull rate, COPs are formed substantially throughout the crystal in the radial direction thereof. As the pull rate decreases, the ring-like OSF forming region moves gradually toward the center of the crystal, where it eventually vanishes. Hence, in wafers obtained from a single crystal grown at a low pull rate, dislocation clusters are formed substantially throughout the entire crystal in the radial direction thereof. Incidentally, the cross-section of the crystal shown in FIG. 1 corresponds to the sectional view taken at position A in FIG. 2.

Both dislocation clusters and COPs are harmful grown-in defects that have deleterious effects on device characteristics. However, because COPs are less harmful and given the demand for high productivity, up until now growth has been carried out entirely under high pull rate conditions such that the OSF-forming region as shown in the region above position D in FIG. 2 is either to be positioned at the outside edge of the crystal or to be excluded entirely from the crystal.

However, with the rapid trend in integrated circuits towards smaller geometries in recent years, even the harmfulness of COPs has become of concern. Hence, there has arisen a need to prevent the formation of not only dislocation clusters, but also COPs. Prior-art which addresses this need includes the growth of defect-free crystals using point defect distribution control in the manner described in Patent Reference 1 and Patent Reference 2.

In Patent References 1 and 2, the above-mentioned effect to control the defect distribution by adjusting the temperature distribution within the crystal just after solidification is utilized for achieving the grown-in defect-free crystals.

That is, in conventional CZ pulling, just after the crystal solidifies, the crystal releases heat from its outside surface. Hence, with regard to the axial temperature gradients within the crystal just after solidification, the temperature gradient Ge at the circumferential portion of the crystal tends to be larger than the temperature gradient Gc at the center portion. As a result, in the defect distribution, especially the ring-like OSF-forming region, as seen in a longitudinal section view of a single crystal grown while gradually lowering the pull rate, the center portion is projecting downwardly and the projecting portion is pointed V-like shape. Hence, even when pull conditions near the critical pull rate at which the ring-like OSF-forming region vanishes at the center of the crystal are used, a grown-in defect-free region are formed to a limited extent only at the center of the crystal, and it is not possible in this way to obtain the defect-free region throughout the crystal in the radial direction thereof.

Here, dislocation clusters and COPs do not, of course, arise in the defect-free region inside the ring-like OSF-forming region. Nor do they arise in the ring-like OSF-forming region itself or in the oxygen precipitation accelerating region or the oxygen precipitation inhibiting region outside of the ring-like OSF-forming region. That is, these four regions are all grown-in defect-free regions.

By modifying the hot zone structure in the crystal pulling furnace so as to thermally insulate the crystal just after solidification from the outside surface thereof, the temperature gradient Gc at the center portion of the crystal can be made the same as or larger than the temperature gradient Ge at the circumferential portion of the crystal. In this way, as shown in FIG. 3, in the longitudinal section view of a single crystal grown while gradually lowering the pull rate, the shape of the ring-like OSF-forming region acquires a U-like shape which retains the downwardly projecting tendency but the center portion is flattish. Moreover, together with using the modified hot zone structure, by employing pull conditions near the critical pull rate at which the ring-like OSF-forming region disappears at the center of the crystal, the crystal can be made free of defects throughout the entire crystal in the radial direction thereof. Here, in FIG. 3, these pull rate conditions fall within the B-C range.

Other related art for achieving a defect-free crystal involves pulling the crystal in a hydrogen atmosphere, as described in Patent Reference 3 and Patent Reference 4. Such an approach in which a very small amount of hydrogen gas is mixed into the inert gas introduced into the pulling furnace, can inhibit the formation of vacancy defects in the same way as nitrogen doping of the silicon melt.

In a process in which a grown-in defect-free crystal is grown by controlling the defect distribution as described in Patent Reference 1 and Patent Reference 2, a low pull rate near the critical pull rate at which the OSF-forming region vanishes at the center of the crystal must be selected as the crystal pulling condition. Hence, a decrease in productivity is unavoidable.

Moreover, the range of the pull rate for achieving a grown-in defect-free crystal (margin: the B-C range in FIG. 3) is narrow, making it difficult to stably grow a grown-in defect-free crystal. It is thus difficult to achieve a grown-in defect-free crystal over the entire length of the crystal, resulting in a lower production yield of grown-in defect-free crystal. For this reason, reducing the production costs of grown-in defect-free crystals has been a challenge. In particular, as the crystal diameter has increased to 200 mm and 300 mm, it has become increasingly difficult to satisfy the relationship Ge<Gc and the range B-C of the pull rate for achieving the defect-free crystal has tended to become even narrower. Accordingly, there exists a desire for new technology capable of overcoming this hurdle.

With regard to the range of the pull rate for obtaining a grown-in defect-free single crystal, because the prior-art range of the pull rate for producing a grown-in defect-free crystal (margin: the range E-C in FIG. 3) is narrow, in a prior-art grown-in defect-free crystal that has been pulled, the oxygen precipitation-accelerating region which is a vacancy type grown-in defect-free region (PV region) and the oxygen precipitation-inhibiting region which is an interstitial type grown-in defect-free region (PI region) (and also the ring-like OSF region in the case of a low-oxygen crystal containing $12 \times 10_{17}$ atoms/cm$^3$ or fewer) end up intermingled. As a result, there is a possibility that oxygen precipitation properties such as the oxygen precipitate density and size, as well as the denuded zone (DZ) width, may not be uniform in the in-plane direction of the wafer.

That is, because the PV region and the PI region are intermingled within the wafer, the oxygen precipitate distribution in a device process will be non-uniform. Therefore, both areas having a strong gettering ability and areas having a weak gettering ability exist. Also, an active region in the vicinity of a surface layer of a device must be free not only of COPs and dislocation clusters, but also of oxygen precipitates and secondary defects thereof such as OSFs and punch-out dislocations. Yet, the width of the region in which such defects are absent, i.e., the DZ width, is non-uniform in the in-plane direction of the wafer. These non-uniform distributions in the intrinsic gettering (IG) ability and DZ width result in a variability in the device characteristics and a lower yield. To avoid such non-uniformities, it would be desirable to have the ability to produce a grown-in defect-free crystal composed only of a PV region or a PI region.

However, even were it possible to produce a grown-in defect-free crystal composed only of a PV region, because of the ready tendency of oxygen to precipitate, it would be necessary to prevent forming oxygen precipitates and secondary defects thereof within the active region of the device. Therefore, the allowable oxygen concentration range would have to be limited to a low-oxygen region (e.g., [Oi]<12× 10$^{17}$ atoms/cm$^3$), which makes it impossible to manufacture in a high-oxygen region.

Therefore, it had been hoped that grown-in defect-free crystals composed only of a PI region which does not allow oxygen precipitates and their secondary defects to form in the active region of the device even in a high-oxygen region could be stably and efficiently grown; however, the margin width of the pull rate for obtaining a grown-in defect-free crystal composed entirely of a PI region has hitherto been very narrow, which makes it impossible to prepare wafers composed entirely of a PI region.

(Patent Reference 1) Japanese Patent Application, First Publication No. 2001-220289

(Patent Reference 2) Japanese Patent Application, First Publication No. 2002-187794

(Patent Reference 3) Japanese Patent Application, First Publication No. 2000-281491

(Patent Reference 4) Japanese Patent Application, First Publication No. 2001-335396

DISCLOSURE OF THE INVENTION

It is therefore an object of the invention to provide a method for growing silicon single crystals by which grown-in defect-free crystals, particularly crystals consisting essentially of a PI region, can be manufactured stably and efficiently. Additional objects of the invention are to provide high-quality and low-cost mirror-polished silicon wafers prepared with the aid of such a method for growing silicon single crystals, and to provide a method for manufacturing such silicon wafers.

We have conducted investigations on crystal pulling technology in a hydrogen-containing atmosphere in an effort to improve the low productivity and yield hitherto experienced in the growth of grown-in defect-free crystals by defect distribution control. Based on our results, we have arrived at the following two conclusions.

First, when a hot zone structure is used which is modified so that the temperature gradient Gc at the center portion of the crystal is equal to or larger than the temperature gradient Ge at the circumferential portion of the crystal so as to change the OSF-forming region to a U-like shape in a longitudinal section view of a single crystal grown while gradually lowering the pull rate, admixing a very small amount of hydrogen gas in the inert gas introduced into the crystal pulling furnace brings about a change in the defect distribution in the longitudinal section of the crystal. Specifically, as shown in FIG. 4, the range B'-C' of the pull rate for achieving a defect-free crystal expands in the axial direction relative to the range B-C of the pull rate for achieving a defect-free crystal when hydrogen is not included (FIG. 3).

Second, this expansion in the range of the pull rate appears as a result of a rise in the critical pull rate $V_o$ at which the ring-like OSF-forming region vanishes at the center of the crystal and a lowering in the critical pull rate Vd at which dislocation clusters form. That is, compared with the range B-C of the pull rate in FIG. 3 obtained using an atmosphere containing no hydrogen, the range B'-C' of the pull rate for achieving a defect-free crystal expands toward the high-rate side (i.e., upward in FIG. 3) and toward the low-rate side (i.e., downward in FIG. 3). This effect is explained below while referring to FIG. 5.

FIG. 5 shows the degree of influence by defect distribution on the relationship between the pull rate and the OSF ring diameter. In this graph, the dashed line represents a case in which the temperature gradient Gc at the center portion of the crystal is smaller than the temperature gradient Ge at the circumferential portion of the crystal; that is, a case in which the OSF-forming region in a longitudinal section view of a single crystal grown while gradually lowering the pull rate has the center portion projecting downwardly and V-like shape. In this case, as the pull rate decreases, the OSF ring diameter gradually shrinks, converging to 0 at the critical pull rate Vo.

The thin solid line represents a case in which the temperature gradient Gc at the center portion of the crystal is the same as or larger than the temperature gradient Ge at the circumferential portion of the crystal, that is, a case in which the OSF-forming region in a longitudinal section view of a single crystal grown while gradually decreasing the pull rate changes to a U-like shape, and in which the atmosphere contains no hydrogen. In this case, the pull rate at which the OSF ring diameter starts to shrink decreases, shrinkage occurs abruptly from this starting rate, and the pull rate converges to 0 at substantially the same critical pull rate Vo as in the case represented by the dashed line. That is, the critical rate Vo remains the same, with the gradient of decrease in the ring diameter becoming more sudden. As a result, a defect-free single crystal with no dislocation clusters or COPs present throughout the crystal in the radial direction grows near the critical rate Vo. However, since the critical rate Vo does not rise, low-rate pulling must be carried out.

The thick solid line represents a case in which the temperature gradient Gc at the center portion of the crystal is the same as or larger than the temperature gradient Ge at the circumferential portion of the crystal, that is, a case in which the OSF-forming region in a longitudinal section view of a single crystal grown while gradually decreasing the pull rate changes to a U-like shape, and in which the atmosphere contains hydrogen. In this case, compared with the fine solid line, the gradient of decrease in the ring diameter remains steep and the critical rate increases from Vo to Vo'. The thick solid line has the same shape as the thin solid line, but is shifted more toward the high pull rate side.

Hence, by pulling in a hydrogen atmosphere in a growth of grown-in defect-free crystals, the critical rate at which the ring-like OSF region vanishes at the center of the crystal rises, which makes it possible to grow at a higher pull rate than in the conventional techniques a grown-in defect-free single crystal which, in the as-grown state, contains no dislocation clusters or COPs throughout the crystal in the radial direction thereof. Moreover, pulling the crystal in a hydrogen-containing atmosphere has the effect of lowering the lower limit Vd of the range of the pull rate at which dislocation clusters arise to Vd', thereby broadening the range of the pull rate for achieving a defect-free crsytal from B-C to B'-C'. As a result, a defect-free crystal can be stably grown, and the production yield for grown-in defect-free crystals increases markedly.

The reason for the expansion in the range of the pull rate for achieving a grown-in defect-free crystal when pulling is carried out in a hydrogen-containing atmosphere, i.e., the reason for the rise in the critical pull rate Vo at which the ring-like OSF region vanishes and the fall in the critical pull rate Vd at which dislocation clusters appear, is thought to be as follows.

When silicon wafers are heat treated and quenched in a hydrogen at a high temperature of 1300 to 1390° C., vacancies or interstitials which are interstitial silicon atoms react with hydrogen to form vacancy-hydrogen or interstitial-hydrogen complexes (Reference 1: M. Suezawa, $1100^{th}$ *Workshop Text of the Meeting of the Division of Materials Science and Crystal Technology of the Japan Society of Applied Physics*, p. 11 (Jun 3, 1999)). Therefore, when a CZ crystal is grown in a hydrogen-containing inert gas atmosphere, at temperatures higher than the temperatures at which grown-in defects are formed during crystal cooling, such as COPs (approx. 1100° C.) and dislocation clusters (approx. 1000° C.), the vacancies or interstitials present in excess within the silicon crystal react with hydrogen to form complexes such as vacancy-hydrogen or interstitial-hydrogen, which lowers the vacancy concentration or the interstitial concentration. The aggregation of vacancies or interstitials is thus inhibited, thereby, a CZ crystal can be obtained in which COPs and dislocation clusters are either absent or of small size.

However, in the case in which a CZ crystal is grown in a hydrogen-containing inert atmosphere and under vacancy rich conditions where the ratio V/G is sufficiently large, it is known that empty-space-in-silicon (thought to be vacancy aggregates) called "hydrogen defects" which ranges from several microns to several tens of microns in size is formed when the hydrogen concentration is high (Reference 2: E. Lino, K. Takano, M. Kimura, H. Yamagishi: Material Science and Engineering B36 (1996), 146-149; Reference 3: T. H. Wang, T. F. Ciszk, and T. Schuyler: J Cryst. Growth 109 (1991), 155-161). In the case in which a CZ crystal is grown in a hydrogen-containing inert atmosphere and under interstitial rich conditions where the ratio V/G is sufficiently small, it is known that interstitial type hydrogen defects (dislocation pairs thought to be aggregates of interstitials) are formed (Reference 4: Y. Sugit: Jpn. *J AppL. Phys.* 4 (1965), 962).

Hence, even without lowering the pull rate to not higher than the critical rate at which the ring-like OSF region are formed, COP formation can be inhibited when a crystal is pulled by the CZ method in an atmosphere that contains a sufficient amount of hydrogen. However, due to formation of empty-space-in-silicon, this approach cannot be used to obtain semiconductor wafers. The formation of dislocation clusters is also inhibited when a crystal is pulled at low pull rate, but wafers thus obtained cannot be used as semiconductor wafers owing to the appearance of dislocation pairs.

FIG. 6 shows the relationship of the vacancy concentration Cv and interstitial concentration Ci versus the ratio V/G of the pull rate V to the temperature gradient G on the crystal side in the vicinity of the solid-liquid interface, at temperatures at the center of the crystal during CZ crystal growth of 1100° C. or more. This graph, which illustrates the effect for inhibiting the formation of COP and dislocation clusters when hydrogen is present in the crystal, is used below to explain why the formation of COPs and dislocation clusters is inhibited. Here, Vo, Vc and Vd represent respectively the critical pull rates at which the ring-like OSF region, COPs and dislocation clusters begin to form at the center of the crystal or in a portion of the radial direction thereof. Also, Cv-OSF, Cv-COP and Ci-disl represent respectively the critical concentrations of point defects at which a ring-like OSF region, COPs and dislocation clusters are formed.

When a crystal is grown using a CZ furnace having a hot zone designed so that the V/G ratio in the radial direction satisfies the relationship Gc≧Ge in order to be able to grow a grown-in defect-free crystal, if the pull rate is made higher than Vo (in the case in which [H2]=0 in FIG. 6), COPs, which are vacancy-rich point defect species, are generally formed. However, when a CZ crystal is grown in a hydrogen-containing atmosphere (cases H1 and H2 in FIG. 6), complexes are formed from the vacancies and hydrogen, thereby, the concentration of free vacancies is lowered. This decrease in the concentration of free vacancies is dependent on the hydrogen concentration in the crystal; as the hydrogen concentration increases, the decrease in the vacancy concentration becomes larger. Hence, when hydrogen is present, the pull rate Vo for OSF ring formation shifts towards higher pull rates, such as Vo' or Vo", and the pull rate Vc for COP formation also shifts towards higher pull rates, such as Vc' or Vc".

On the other hand, when the pull rate is made lower than Vd (in the case in which [H2]=0 in FIG. 6), interstitial-rich point defect species are formed, the interstitial concentration Ci becomes greater than Ci-disl, and dislocation clusters are generally formed as secondary defects of the interstitials. However, when the crystal is grown in a hydrogen-containing atmosphere (the case in which [H2]=H1 or H2 in FIG. 6), complexes are formed from the vacancies and hydrogen, thereby, the concentration of free interstitials is lowered. Therefore, the pull rate Vd for forming dislocation clusters shifts towards lower pull rates, such as to Vd' or Vd", so as to coincide with the critical concentration Ci-disl.

In the case in which the hydrogen concentration is relatively low, such as [H2]=H1 or H2 in FIG. 6, if V/G is sufficiently large, the vacancy concentration becomes higher than the critical concentration Cv-COP for COP formation. Hence, COP formation cannot be completely inhibited, however, since the vacancy concentration is lower than that in the case in which the hydrogen is absent, the COPs are smaller in size.

In a range of the pull rate from the critical rate Vd' or Vd" for dislocation cluster formation or more to the critical rate Vo' or Vo" for ring-like OSF formation or less, the vacancy concentration and the interstitial concentration are sufficiently low. Therefore, COPs and dislocation clusters are not formed. Moreover, vacancy type hydrogen defects that are empty-space-in-silicon and interstitial type hydrogen defects that are dislocation pairs are neither formed. Furthermore, because the range (margin) of the pull rate for forming a grown-in defect-free crystal is much larger than that in the case in which a crystal is pulled without a hydrogen-containing atmosphere, defect-free crystals can be grown more stably at a higher yield.

If the V/G ratio is larger than, yet relatively close to, the critical V/G condition at which the OSF ring closes, the ring OSF does not close at the center of the crystal and COPs are formed within the region inside the ring. Yet, because the vacancy concentration decreases due to pulling in a hydrogen-containing atmosphere, the COPs are of a small size. Also, the vacancy concentration in such cases is sufficiently low that empty-space-in-silicon formation does not occur.

The present invention, which was ultimately arrived at based on these findings, relates to wafers prepared from a silicon single crystal grown by the CZ method in a hydrogen-containing inert gas atmosphere, and the wafers are completely grown-in defect-free wafers which, in the as-grown state (i.e., no heat treatment incurred after pulling), have no COPs throughout the wafer in the thickness and radial directions thereof.

The above-described problems have been resolved by the silicon wafer of the present invention which is obtained from a silicon single crystal grown by the CZ method in a hydrogen-containing inert gas atmosphere. The silicon wafer of the present invention is a completely grown-in defect-free wafer containing no COPs or dislocation clusters throughout the wafer in the thickness and radial directions thereof, and all the portions thereof consist essentially of an interstitial rich region (interstitial type grown-in defect-free region).

In the practice of the present invention, it is preferable to heat-treat the silicon wafer so as to have uniform distributions in oxygen precipitate density, oxygen precipitate size and DZ width in the plane direction of the silicon wafer.

The method for growing silicon single crystals of the present invention is for growing a grown-in defect-free single crystal consisting essentially of an interstitial rich region by the CZ method. This method includes pulling a silicon single crystal in a hydrogen-containing inert gas atmosphere so as to expand the range of the pull rate for the PI region at which a single crystal containing no COPs or dislocation clusters throughout the crystal in the radial direction thereof and having an interstitial rich region (an interstitial type grown-in defect-free region) can be pulled. By pulling the crystal at a pull rate within this expanded range of the pull rate for the PI region, a grown-in defect-free silicon single crystal having a body portion that is an interstitial rich region (PI region) is grown. Then, the above-described problems have also been resolved.

A hydrogen-containing atmosphere obtained by including a hydrogen-containing substance in an inert gas may be used as the atmosphere in which a silicon single crystal is grown. The concentration of the hydrogen-containing substance in the hydrogen-containing atmosphere may be set in the specific concentration range described subsequently in terms of the hydrogen gas equivalent concentration.

The hydrogen-containing substance may be a hydrogen gas. The hydrogen gas concentration in the hydrogen-containing atmosphere can be set within a specific concentration range.

As used herein, "hydrogen-containing substance" refers to a substance which contains hydrogen atom in its molecule and which, when dissolved in a silicon melt, thermally decomposes and can supply hydrogen atom to the silicon melt. By mixing this hydrogen-containing substance into an inert gas and introducing the resulting mixed gas into the atmosphere during silicon single crystal growth, the hydrogen atoms can be dissolved in the silicon melt. Specific examples of hydrogen-containing substances include hydrogen atom-containing inorganic compounds such as hydrogen gas, $H_2O$ and HCl, silane gases, hydrocarbons such as $CH_4$ and $C_2H_2$, and hydrogen atom-containing organic compounds such as alcohols and carboxylic acids. The use of hydrogen gas is especially preferred. The inert gas is preferably low-cost argon gas, although various other rare gases such as helium, neon, krypton and xenon may be used singly or in admixture.

In the present invention, the concentration of the hydrogen-containing substance in the hydrogen-containing atmosphere is set in a predetermined concentration range based on the hydrogen gas equivalent concentration. The hydrogen gas equivalent concentration is used here because the amount of hydrogen atoms obtained from the thermal decomposition of the hydrogen-containing substance in the silicon melt is dependent on the number of hydrogen atoms originally present in the hydrogen-containing substance. For example, 1 mole of $H_2$ is present in 1 mole of $H_2O$, whereas only 0.5 mole of $H_2$ is present in 1 mole of HCl. Therefore, in the practice of the present invention, it is desirable to use as the standard a hydrogen-containing atmosphere obtained by introducing a given concentration of hydrogen gas into an inert gas, and then to select the concentration of hydrogen-containing substance so as to obtain an atmosphere equivalent to the atmosphere serving as this standard. The preferred concentration of hydrogen-containing substance at this time is specified in terms of the hydrogen gas equivalent concentration.

That is, in the present invention, assuming that the hydrogen-containing substance dissolves in the silicon melt and thermally decomposes in the high-temperature silicon melt to form hydrogen gas, the amount of hydrogen-containing substance added should be set so that the hydrogen gas equivalent concentration in the atmosphere (following conversion) falls within the predetermined concentration range.

In the method for growing a single crystal of the present invention, when the silicon single crystal is grown in a hydrogen-containing atmosphere prepared by including a specific concentration (hydrogen gas equivalent concentration) of hydrogen-containing substance in the inert gas, the hydrogen atoms from the hydrogen-containing substance dissolve in the silicon melt and those hydrogen atoms are taken up in the silicon lattice during solidification of the silicon.

In the present invention, a means may be employed to expand the range of the pull rate for the PI region in a hydrogen-containing inert gas atmosphere to at least twice as wide as the range in an inert gas atmosphere which contains no hydrogen.

Moreover, the hydrogen concentration in the inert gas atmosphere can be set within a range of at least 3% but not more than 20% relative to a pressure in a furnace of 4.0 to 9.33 kPa (30 to 70 torr).

In the above-described method for growing silicon single crystals of the present invention, the hydrogen concentration VH (vol %), air concentration VAir (vol %) and argon concentration VAr (vol %), when indicated as points (VH, VAr, VAir) in appended FIG. 12, may be values which lie within a non-combustion range enclosed by point A (100, 0, 0), point B (0, 100, 0), point C (0, 0, 100), point D (4, 0, 96), point E (4, 84, 12) and point F (75, 0, 25).

The specific concentration range mentioned above is the range obtained by excluding the triangle DEF from the triangle ABC in FIG. 12.

The reason for selecting the above range is that the dilution limit point in the combustion zone is the point E (4, 84, 12).

In a CZ single crystal grown in a hydrogen atmosphere, the range (margin) of the pull rate at which a grown-in defect-free crystal region can be obtained becomes larger as the hydrogen concentration is higher. Hence, from the standpoint of quality and productivity (yield), there is no upper limit in the hydrogen concentration; even 100% would be acceptable. On the other hand, from the standpoint of safety, as explained below, there does arise an upper limit in the hydrogen concentration range.

(1) Hydrogen Concentration in Range Enclosed by Points A, F, L and J in FIG. 12:

In a CZ furnace under a reduced pressure, if an air leak occurs for some reason during operation at the concentration at an arbitrary point Ma in the range enclosed by points A, F, L and J in FIG. 12, the composition of the atmosphere in the furnace changes from point Ma to point C (0, 0, 100) at 100% air, inevitably passing through a detonation zone within the region enclosed by point G (18, 0, 82), point H (18, 50, 32) and point I (59, 0, 41). However, if the CZ furnace has a construction that does not leak air, the hydrogen concentration has no upper limit and safe operation is possible even at 100%.

Here, point J is the point at which the straight line connecting the 100% air point C (0, 0, 100) with point H (18, 50, 32) at the dilution limit of detonation intersects the axis AB. Also, point L is the point at which the straight line connecting point 100% air C (0, 0, 100) with point H (18, 50, 32) at the dilution limit of detonation intersects the combustion upper limit boundary line EF.

(2) Hydrogen Concentration in Range Enclosed by Points J, L, E and K in FIG. 12:

In a CZ furnace under reduced pressure, when an air leak occurs for some reason during operation at the concentration at an arbitrary point Mb in the range enclosed by points J, L, E and K in FIG. 12, the composition of the atmosphere within the furnace changes from point Mb to point C (0, 0, 100) at 100% air, inevitably passing through a combustion zone enclosed by points D, E and F. In such a case, if the CZ furnace has a construction that does not leak air, safe operation is of course possible. Even if the furnace has a construction in which there is a possibility of air leakage, safe operation is possible provided the increase in pressure due to combustion does not exceed the atmospheric pressure. Moreover, even in a case in which pressure fluctuations due to combustion exceed the atmospheric pressure, if the furnace has a construction which releases the pressure, it is possible to safely reduce the pressure fluctuations. With a CZ furnace having such a construction designed for safety, even when the hydrogen concentration upper limit is set to a value indicated by the point J in FIG. 12, safe operation is possible. Here, point K is the point at which the straight line connecting point 100% air C (0, 0, 100) with point E (4, 84, 12) at the dilution limit of combustion intersects the axis AB.

(3) Hydrogen Concentration in Range Enclosed by Points K, E, D, C and B in FIG. 12:

In a CZ furnace under reduced pressure, when an air leak occurs for some reason during operation at the concentration at an arbitrary point Mc in the range enclosed by points K, E, D, C and B in FIG. 12, the composition of the atmosphere in the furnace changes from point Mc to point C (0, 0, 100) at 100% air without passing through either the combustion zone or the detonation zone. Therefore, so long as the furnace is equipped with a mechanism to control the hydrogen concentration within the furnace, safe combustion is possible. However, if the mechanism for controlling the hydrogen concentration in the furnace does not function correctly or has a low precision, it may indicate a hydrogen concentration that is lower than the actual concentration, presenting the possibility that hydrogen will be fed in excess of the upper limit of point K. In such a case, the condition in the furnace will be like that described in the above (2). Hence, if similar safety features have been incorporated into the design of the furnace, safe operation will be possible.

It is desirable for the pressure in the furnace to be 10 torr or more, preferably in a range from 30 to 200 torr, and more preferably in a range from 30 to 70 torr. Given that the hydrogen concentration in the melt and the crystal will be low if the partial pressure of hydrogen is low, the lower limit in the furnace pressure has been set at the above value so as to prevent this from happening. On the other hand, when the pressure in the furnace rises, the flow rate of inert gas such as argon over the melt decreases, making it difficult to exhaust from the furnace carbon that has degassed from a carbon heater or carbon members of the furnace and gaseous substances such as SiO that have vaporized from the melt, and resulting in an increase in the carbon concentration in the crystal. Moreover, in areas at the top of the melt in the furnace at temperatures of about 1100° C. or less, SiO agglomerates, and dusts are generated which falls into the melt and causes dislocations to form within the crystal. The above-indicated upper limit in the furnace pressure has been set so as to prevent such undesirable effects from occurring.

In the practice of the present invention, it is advantageous to pull a plurality of single crystals at a pull rate within the range of the pull rate for the PI region in the above-described crystal growing process.

In a method for manufacturing silicon wafers of the present invention, the wafers may be sliced from a single crystal grown by the above-described method for growing silicon single crystals.

The method for manufacturing silicon wafers may further include an annealing treatment.

The hydrogen concentration in the silicon single crystal during growth in a hydrogen-containing inert gas atmosphere can be controlled by means of the hydrogen partial pressure in the atmosphere. This hydrogen partial pressure can be controlled by controlling the hydrogen concentration and the pressure in the furnace. Hydrogen doping into the crystal takes place as follows. Hydrogen in the atmosphere dissolves into the silicon melt and reaches a steady (equilibrium) state, in addition to which the hydrogen concentration in the liquid and solid phases is differentially distributed by concentration segregation during solidification to a crystal.

According to Henry's law, the hydrogen concentration in the melt is dependent on the hydrogen partial pressure in the gas phase and is expressed as:

$$P_{H2}=kC_{LH2}.$$

Here, $P_{H2}$ is the hydrogen partial pressure in the atmosphere, $C_{LH2}$ is the hydrogen concentration in the silicon melt, and k is a coefficient between the two.

The hydrogen concentration in the silicon single crystal, which is determined by the relationship between the hydrogen concentration in the melt and segregation, is expressed as:

$$C_{SH2}=k'C_{LH2}=(k'/k)P_{H2}.$$

Here, $C_{SH2}$ is the hydrogen concentration in the crystal, and k' is the segregation coefficient for hydrogen between the silicon melt and the silicon crystal.

From the above, the hydrogen concentration in the crystal just after solidification can be adjusted to a constant desired concentration in the axial direction of the crystal by controlling the hydrogen partial pressure in the atmosphere.

The silicon wafer of the present invention can be used as a polished wafer (PW).

Because it is obtained from a crystal grown in a hydrogen-containing inert gas atmosphere and is composed throughout only of an interstitial rich region (PI region), the silicon wafer of the present invention does not contain a PV region. Hence, uniformity can be maintained in the wafer.

Wafer uniformity can be maintained based on such parameters as the oxygen concentration and the heat treatment temperature and time. Specifically, the oxygen concentration may be set to from $10\times10^{17}$ to $20\times10^{17}$ atoms/cm$^3$ (Old ASTM F121-1979), and preferably from $12\times10^{17}$ to $18\times10^{17}$ atoms/cm$^3$; the heat treatment temperature may be set to from 450 to 1400° C., and preferably from 1100 to 1250° C.; and the heat treatment time may be set within a range of 0 or more seconds. In this way, there can be obtained excellent wafers in which the oxygen precipitate density, the oxygen precipitate size and the DZ width are highly uniform within the plane of the wafer.

By setting the oxygen concentration [Oi] in the single crystal within a high concentration range of $10\times10^{17}$ to $20\times10^{17}$ atoms/cm$^3$ and carrying out rapid thermal annealing (RTA) treatment, excellent wafers which are uniformly endowed with oxygen precipitate density and oxygen precipitate size that ensure a sufficient gettering ability and with a DZ width sufficient to enable the device active region to be completely defect free can be obtained without carrying out a high-temperature heat treatment for a long time to effect the outward diffusion of oxygen in DZ layer formation.

On the other hand, by setting the oxygen concentration [Oi] in the single crystal within a low concentration range of $10\times10^{17}$ atoms/cm$^3$ or less, even when the device is heat-treated, the formation of oxygen precipitates in the device active region is suppressed, making it possible to reduce or eliminate oxygen precipitates. As a result, excellent wafers can be obtained which are not subject to a deterioration in the device characteristics.

In the method for growing silicon single crystals of the present invention, by pulling a silicon single crystal in a hydrogen-containing inert gas atmosphere, the range of the pull rate for the PI region at which a single crystal containing no COPs or dislocation clusters throughout the radial direction thereof and having an interstitial rich region (PI region) is expanded. By pulling the crystal at a pull rate within this expanded range of the pull rate for the PI region, the crystal is grown such that the body portion is the interstitial rich region (PI region) containing no dislocation clusters. In accordance with the method of the present invention, it is possible to broaden the range of the pull rate for the PI region which has until now had to be set to a very narrow range when pulling grown-in defect-free single crystals, thus enabling grown-in defect-free single crystals to be grown with great ease and at a higher pull rate than in the conventional method.

Here, comparisons between the range of the pull rate for the PI region in a hydrogen-containing atmosphere and the range of the pull rate for the PI region in an inert gas atmosphere containing no hydrogen are carried out on condition that the value of the axial temperature gradient G in the crystal just after solidification is in a fixed and unchanging state.

Specifically, by pulling the silicon single crystal in a hydrogen-containing atmosphere, it is possible to expand the range (margin) of the pull rate for the PI region at which a grown-in defect-free single crystal consisting essentially of an interstitial type grown-in defect-free region (PI region) can be pulled, to at least twice as wide, and, as shown in FIG. 10, even 4.5 times as wide, as the margin when pulling is carried out in an atmosphere containing no hydrogen. Under these condition, the crystal can be pulled.

It is also possible at this time to make the ring-like OSF-forming region smaller. The size of the PV region (vacancy-type grown-in defect-free region) does not change as a result of pulling in a hydrogen-containing atmosphere.

In the practice of the present invention, a grown-in defect-free silicon single crystal can be pulled at a pull rate expanded to the above range in the following case: the case in which the hydrogen concentration in the inert gas atmosphere is set to 3% or more and 10% or less relative to a pressure in a furnace of 10 torr or more (the pressure in the furnace is preferably 30 to 200 torr, and more preferably 30 to 70 torr); or the case in which the hydrogen concentration is set to a value within the non-combustion range for hydrogen enclosed by point A (100, 0, 0), point B (0, 100, 0), point C (0, 0, 100), point D (4, 0, 96), point E (4, 84, 12) and point F (75, 0, 25) in FIG. 12.

For the sake of convenience, the triangular compositional diagram shown in FIG. 12 applies to a system at standard temperature and atmospheric pressure. However, since the combustion zone and detonation zone tend to be suppressed in a furnace operated at reduced pressure, even taking into account the high-temperature atmosphere in the furnace during actual operation, it is possible to avoid entry into the detonation zone and combustion zone within the triangular diameter during actual operation. Therefore, even when the operating conditions in the furnace are taken into consideration, detonation and combustion in actual operation can be avoided by employing the range indicated in the diagram.

In the practice of the present invention, since the range of the pull rate for the PI region required to pull a grown-in defect-free silicon single crystal can be enlarged in the manner of the range of the pull rate for the PI region in the above-described method for growing crystals, a plurality of single crystals can be pulled under identical conditions. Hence, pull rate selection can be carried out more easily, enabling grown-in defect-free single crystals to be pulled. That is, when grown-in defect-free single crystals are pulled a plurality of times with the same growing equipment or are pulled at the same time with a plurality of growing equipments, even though setting the pull rate conditions is easier than in the prior art, it is possible to obtain a range of the pull rate at which grown-in defect-free single crystals can be pulled, enabling single crystals of the desired quality to be grown. This makes it possible to enhance the efficiency of the operation, and to substantially reduce production costs for silicon single crystals and for silicon wafers prepared from these silicon single crystals.

With regard to the added amount of hydrogen gas, if too little hydrogen gas is added, a sufficient effect of increasing the critical pull rate will not be achieved. Hence, the lower limit in the added amount of hydrogen gas is preferably 0.1 vol % or more, and more preferably 3 vol % or more. At less than 0.1%, there is substantially no hydrogen effect. At less than 3% but at least 0.1%, a hydrogen effect is achieved to some degree, although it is insufficient. As for the upper limit in the added amount of hydrogen, safe operation is possible even at a hydrogen concentration of 100%, provided the CZ furnace used is one that is equipped with safety measures, such as a furnace construction that prevents air leakage or has a mechanism to control the hydrogen concentration.

The method for manufacturing silicon wafers of the present invention involves slicing silicon wafers from a high-quality, economical single crystal grown by the method for growing silicon single crystals of the present invention. Silicon wafers which are both of high quality and of modest cost can be prepared in this way.

In the case in which a crystal is grown near the critical pull rates using a conventional hot zone structure by which the temperature gradient Gc at the center portion of the crystal is made to be smaller than the temperature gradient Ge at the circumferential portion of the crystal and the ring-like OSF-forming region in a longitudinal section view of a single crystal grown while gradually lowering the pull rate has a downwardly pointed V-like shape, and further the crystal is grown in a hydrogen atmosphere, it will be difficult to achieve the intended effects of the present invention as shown below.

Even in the case of Ge>Gc, due to the effect of hydrogen, the critical pull rates Vo and Vc at which the ring-like OSF-forming region and COPs begin to arise at the center of the crystal increase, and the critical pull rate Vd at which dislocation clusters begin to form in part of the crystal decrease. Therefore, even in the case of Ge>Gc, if both gradients are relatively close, there will be cases where a completely grown-in defect-free crystal having no COPs or dislocation clusters can be obtained. Yet, considering the margin of the pull rate compared to that in the case of Ge≦Gc, grown-in defect-free crystals cannot be stably produced. Moreover, in the case in which Ge>Gc is satisfied and the difference between Ge and Gc is large, a margin of the pull rate for growing a grown-in defect-free crystal cannot be obtained even with the addition of hydrogen.

An annealing treatment may be included in the method for manufacturing silicon wafers of the present invention.

Here, the annealing treatment may be, for example, rapid thermal annealing (RTA), which can be carried out under conditions such as the following: at a temperature of 1100 to 1350° C.; for more than 0 seconds; in an atmosphere of argon, helium, or in $NH_3$-containing argon or helium. In this way, without carrying out high-temperature heat treatment for a long period of time to effect the outward diffusion of oxygen in DZ layer formation, there can be obtained wafers in which oxygen precipitate density and oxygen precipitate size that ensure a sufficient gettering ability is achieved and a DZ width sufficient to enable the device active region to be completely defect-free can be uniformly ensured.

When a prior-art grown-in defect-free wafer having PV region, PI regions or a ring OSF-forming region intermingled therein is subjected to the RTA treatment like that described above, in the PV region in which vacancies dominate and in the ring-like OSF-forming region, the density and size of oxygen precipitates become relatively large compared with those in the PI region; moreover, the DZ width becomes small. In addition, the oxidation treatment of devices on the silicon wafer gives rise to the formation of OSFs in the ring-like OSF region, resulting in a non-uniform defect distribution. Such problems have been overcome in the uniform grown-in defect-free wafers of the present invention which are composed entirely of a Pi region and are uniform in the plane of the wafer.

By pulling a silicon single crystal in a hydrogen-containing inert gas atmosphere in accordance with the present invention, the range of the pull rate for the transition cluster-free, interstitial rich region is expanded, enabling the growth of a single crystal of an interstitial rich region which contains no COPs or dislocation clusters throughout in the radial direction thereof. As a result, although it has been necessary in the prior-art to set the pull rate within a very narrow range in order to pull a grown-in defect-free single crystal, the present invention enlarges this range of the pull rate, enabling grown-in defect-free single crystals to be very easily grown at a higher pull rate than in the prior art.

EXPLANATION OF REFERENCE SYMBOLS

1: crucible; 1$a$: quartz crucible; 1$b$: graphite crucible; 2: heater; 3: starting material melt; 4: pull shaft; 5: seed chuck; 6: single crystal; 7: heat shield

BEST MODE FOR CARRYING OUT THE INVENTION

Embodiments of the present invention are described below in conjunction with the attached diagrams.

Figure 7:
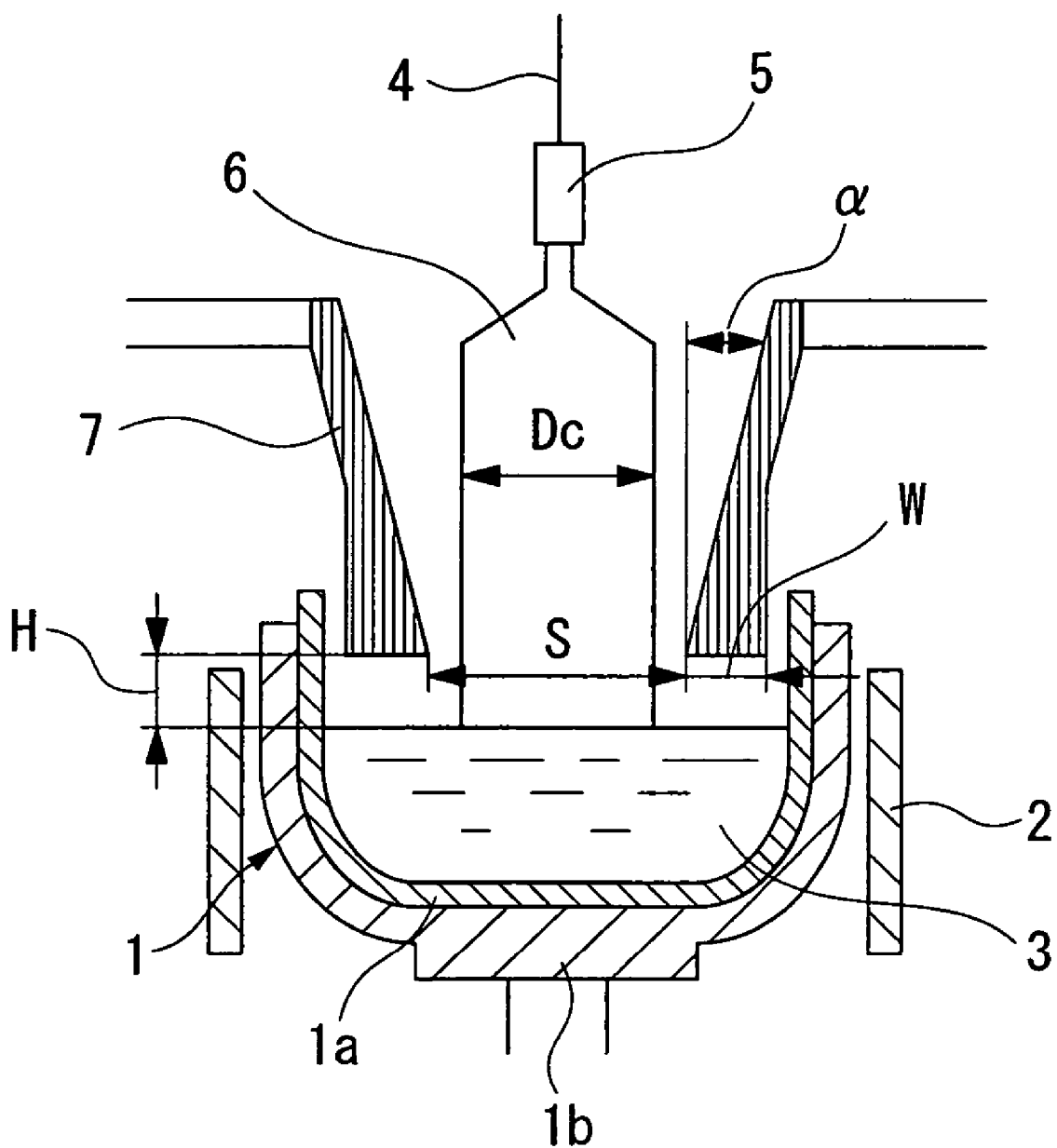
FIG. 7 is a vertical sectional view of a CZ pulling furnace suitable for working the method for growing silicon single crystals of the present invention.

FIG. 7 is a vertical sectional view of a CZ pulling furnace suitable for working the method for growing silicon single crystals of the present invention.

First, the construction of the CZ furnace is described.

The CZ furnace has a crucible 1 which is centrally located within a furnace chamber and a heater 2 disposed outside of the crucible 1. The crucible 1 has a double construction composed of an inner quartz crucible 1$a$ which holds inside a starting material melt 3 and is itself held within an outer graphite crucible 1$b$. The crucible 1 is rotated and vertically driven by a supporting shaft commonly referred to as a pedestal. A cylindrical heat shield 7 is provided above the crucible 1. The heat shield 7 includes an outer graphite shell filled on the inside with a graphite felt. The heat shield 7 has an inner face which is tapered so that the inside radius gradually decreases from the top edge to the bottom edge. The outer face at the top of the heat shield 7 is tapered to match the inner face and the outer face at the bottom is formed as a substantially straight face, so that the thickness of the heat shield 7 gradually increases in the downward direction.

This CZ furnace is capable of growing a 200 mm single crystal having a target diameter of, for example, 210 mm, and a body length of, for example, 1200 mm. The heat shield 7 provides a hot zone structure in which the temperature gradient Gc at the center portion of the crystal is the same as or larger than the temperature gradient Ge at the circumferential portion of the crystal.

Specifications for the heat shield 7 typically includes, for example, an outside diameter for the portion entering the crucible of 470 mm, a minimum inside diameter S at the lowermost end of 270 mm, a width W in the radial direction of 100 mm, and an angle by the inside face (shaped as an inverted truncated cone) to the vertical of 21°. In addition, the crucible 1 may have an inside diameter of, for example 550 mm, and the bottom end of the heat shield 7 may have a height H from the melt surface of, for example 60 mm.

When pulling is carried out using the apparatus for growing single crystals having the above cross-sectional construction, the axial temperature gradient from the melting point to 1370° C. is from 3.0 to 3.2° C./mm at the center portion (Gc) of the single crystal and from 2.3 to 2.5° C/mm at the circumferential portion (Ge), giving a ratio Gc/Ge of about 1.3. This state remains substantially unchanged even when the pull rate is varied.

Next, the procedure for setting the operating conditions for pulling a grown-in defect-free crystal is explained.

First, in order to determine the allowable ranges in the hydrogen concentration and the pull rate at which a defect-free crystal can be obtained, the hydrogen concentration is set to mixing ratios of 0, 0.1, 3, 5, 8 and 10 vol %, and a single crystal of the target diameter (e.g., 210 mm) is grown under each of these conditions.

That is, the crucible is loaded with, for example, 130 kg of high-purity polycrystalline silicon, and p-type (e.g., boron, aluminum, germanium and the like) or n-type (e.g., phosphorus, arsenic, antimony and the like) dopant is added in order to set the electrical resistivity of the single crystal to the desired value, such as 10 Ω·cm. The interior of the apparatus is flushed with argon gas and the internal pressure is lowered to a pressure of 1.33 to 26.7 kPa (10 to 200 torr), and hydrogen is introduced into the furnace at the specific mixing ratios mentioned above of 10 vol % or less with respect to argon.

The silicon is heated with the heater 2, turning it into a melt 3, a seed crystal mounted on a seed chuck 5 is immersed in the melt 3, and the crystal is pulled while rotating the crucible 1 and the pull shaft 4. The crystal orientation may be set to {100}, {111} or {110}. After necking down the seed to make the crystal dislocation free, a shoulder is formed and the cross-section of crystal crown is grown out to the target body diameter.

When the length of the crystal body has reached, for example 300 mm, the pull rate is adjusted to a rate, such as 1.0 mm/min, that is sufficiently higher than the critical rate. Next, the pull rate is lowered in a substantially linear manner in accordance with the pull length so that the pull rate falls below the critical rate, for example, to 0.3 mm/min at the time when the length of the body reaches, for example, 600 mm. And then, the body is grown to a length of perhaps 1200 mm at this pull rate and tailing is carried out under normal conditions, after which crystal growth is brought to an end.

Single crystals that have been grown in this way under different hydrogen concentrations are vertically sectioned along the pull axis so as to fabricate plate-like test pieces containing a region near the pull axis. Copper decoration is then carried out in order to examine the distribution of grown-in defects. First, each test piece is immersed in an aqueous copper sulfate solution, then air dried and subsequently heat treated in a nitrogen ambient at 900° C. for about 20 minutes. Next, in order to remove the copper silicide layer at the surface of the test piece, the test piece is immersed in a HF/HNO$_3$ mixed solution and several tens of microns of material at the surface layer is etched away. The position of the OSF ring and the distribution of the various defect regions are then examined by x-ray topography. Also, the COP density in this slice may be examined by a suitable technique such as the OPP method, and the dislocation cluster density may be examined by Secco etching.

Figure 1:
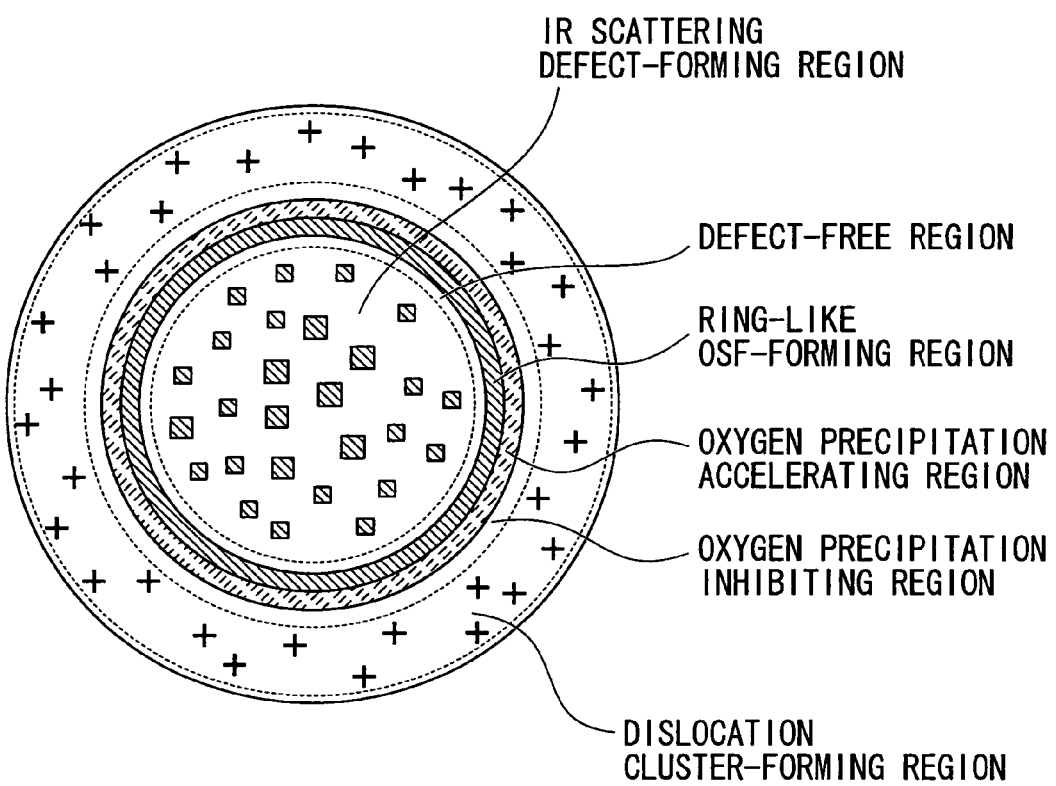
FIG. 1 is a defect distribution diagram in the radial direction of the crystal.
Figure 2:
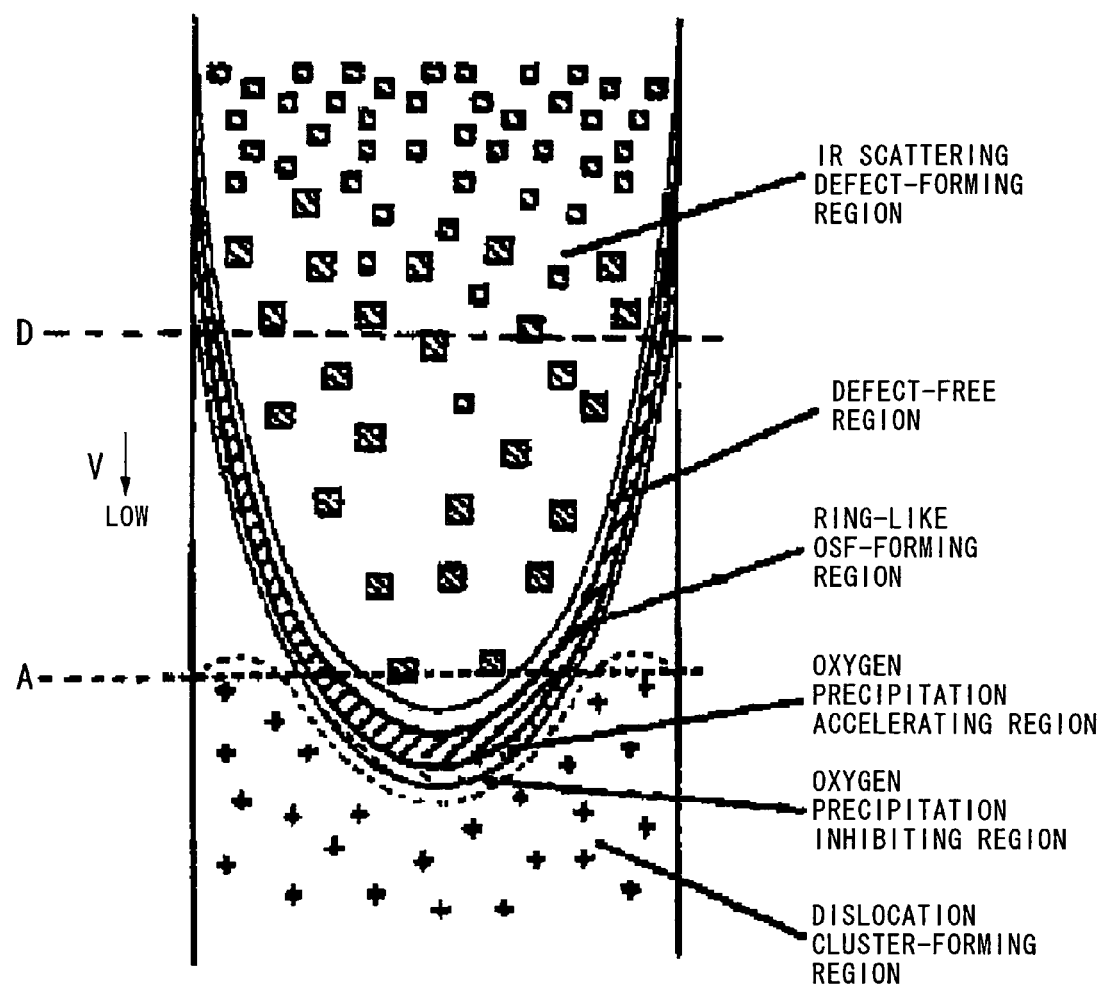
FIG. 2 is a defect distribution diagram in a longitudinal section of a single crystal grown while gradually lowering the pull rate. The diagram shows the case in which the temperature gradient Gc at the center portion of the crystal is smaller than the temperature gradient Ge at the circumferential portion of the crystal.
Figure 3:
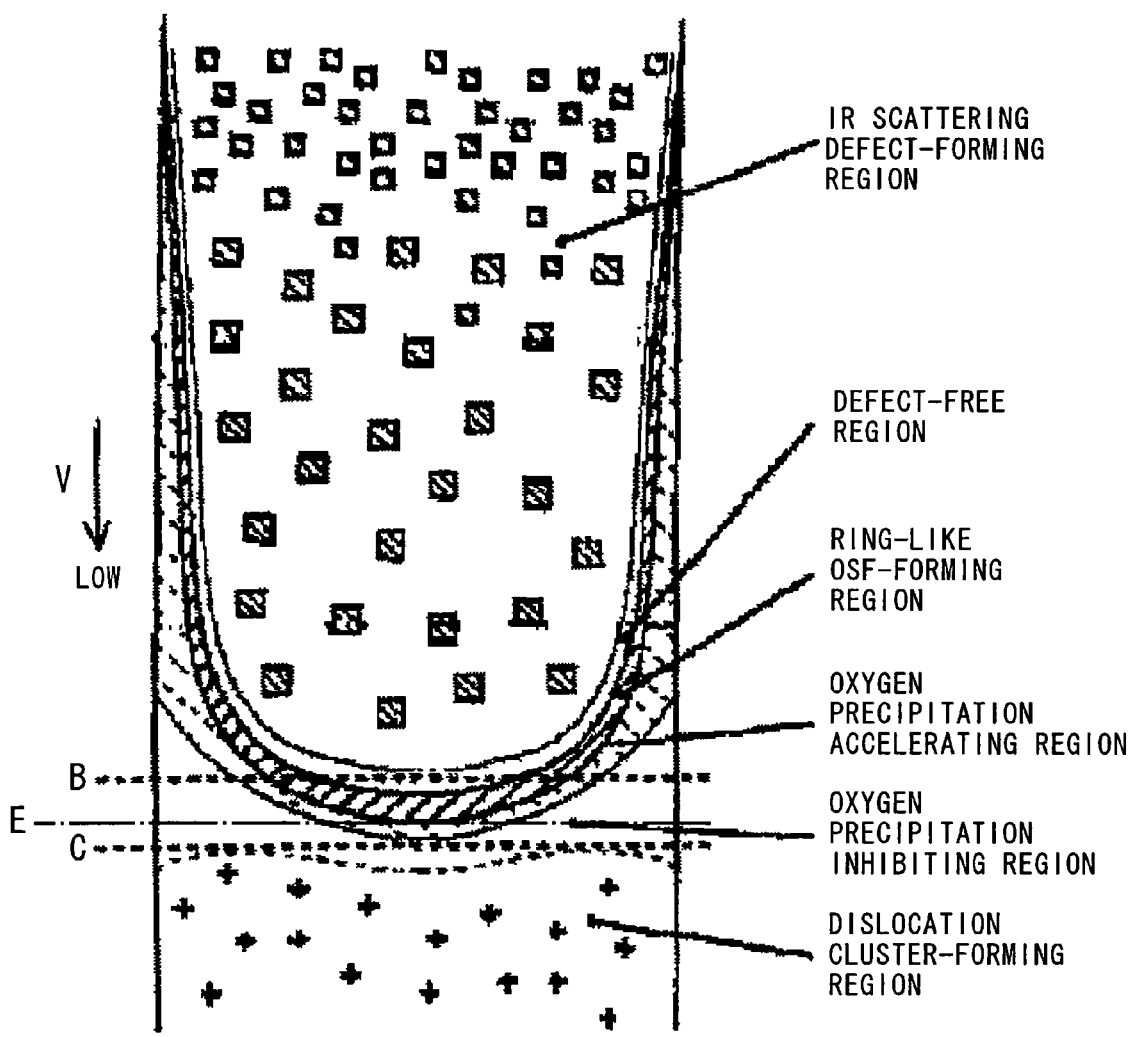
FIG. 3 is a defect distribution diagram in a longitudinal section of a single crystal grown while gradually lowering the pull rate. The diagram shows the case in which the temperature gradient Gc at the center portion of the crystal is the same as or larger than the temperature gradient Ge at the circumferential portion of the crystal.

A crystal grown using this apparatus for growing single crystals which satisfies the relationship of Ge/Gc≧1 has a defect distribution in which, as shown in FIG. 3, the ring-like OSF region exhibits a U-shaped state. As the hydrogen concentration increases, the defect-free region expands in the manner of B'-C' in FIG. 4, enlarging the range (margin) of the pull rate for obtaining a defect-free crystal.

Figure 4:
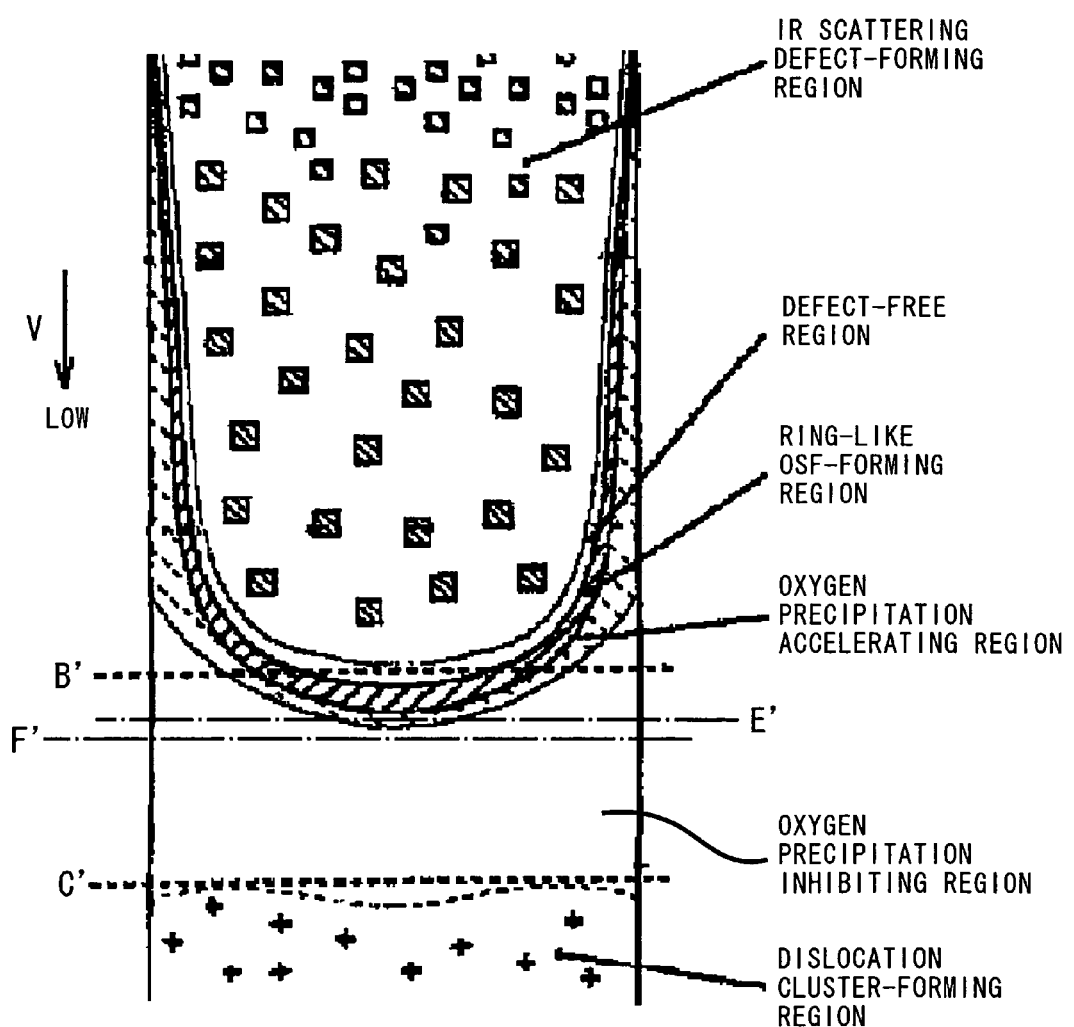
FIG. 4 is a defect distribution diagram in a longitudinal section of a single crystal grown while gradually lowering the pull rate. The diagram shows the case in which the temperature gradient Gc at the center portion of the crystal is the same as or larger than the temperature gradient Ge at the circumferential portion of the crystal, and in which pulling was carried out in a hydrogen atmosphere.
Figure 5:
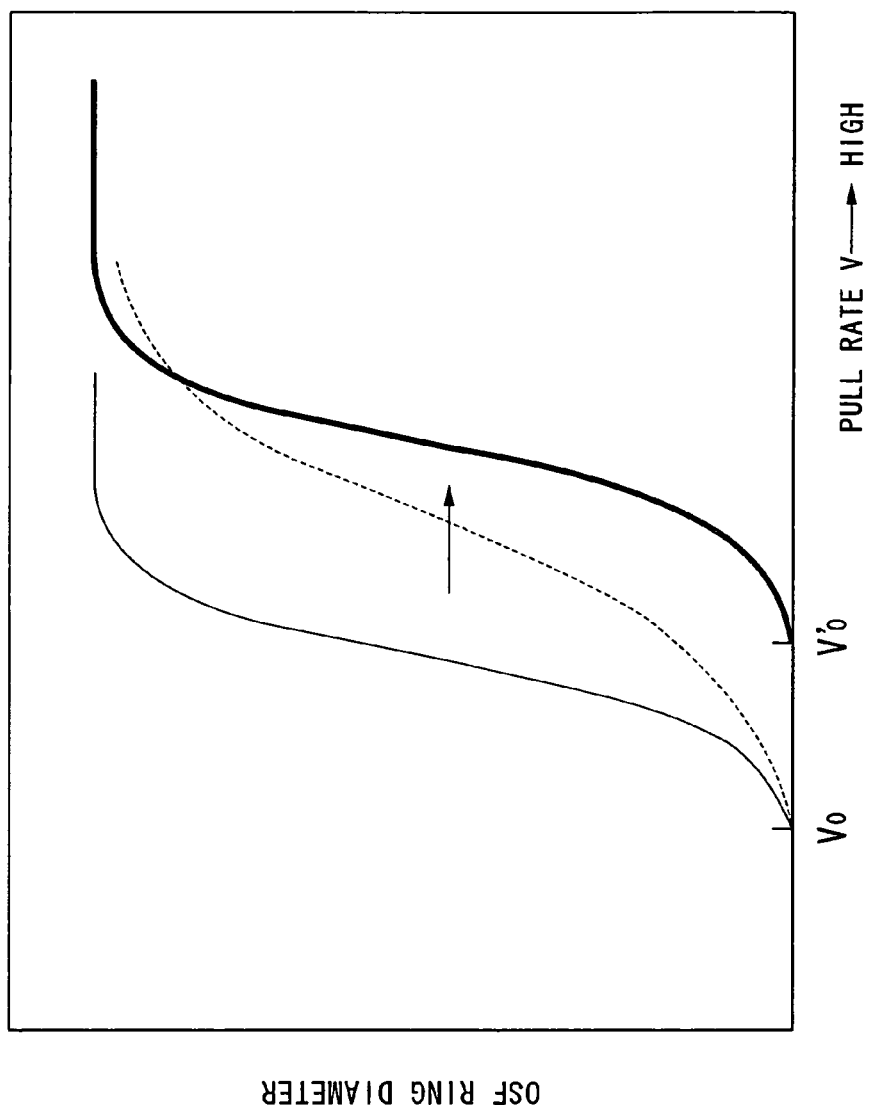
FIG. 5 is a graph showing the degree of influence by defect distribution on the relationship between the pull rate and the OSF ring diameter.
Figure 6:
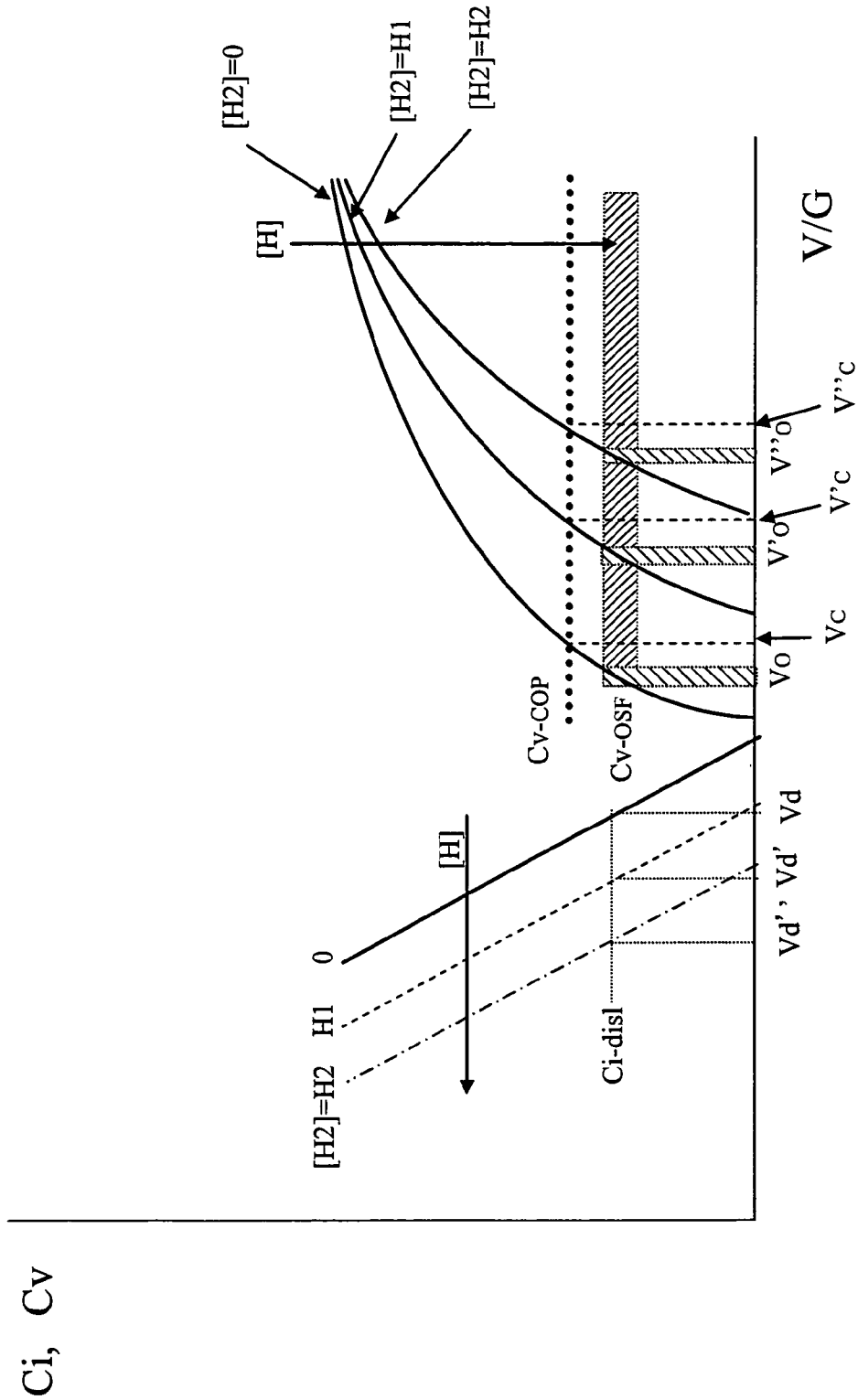
FIG. 6 is a graph showing the influence of the ratio V/G on the point defect concentration and on conditions for forming the various defect regions. The diagram shows shifts of critical V/Gs for defect formation due to pulling in hydrogen-containing atmosphere.
Figure 10:
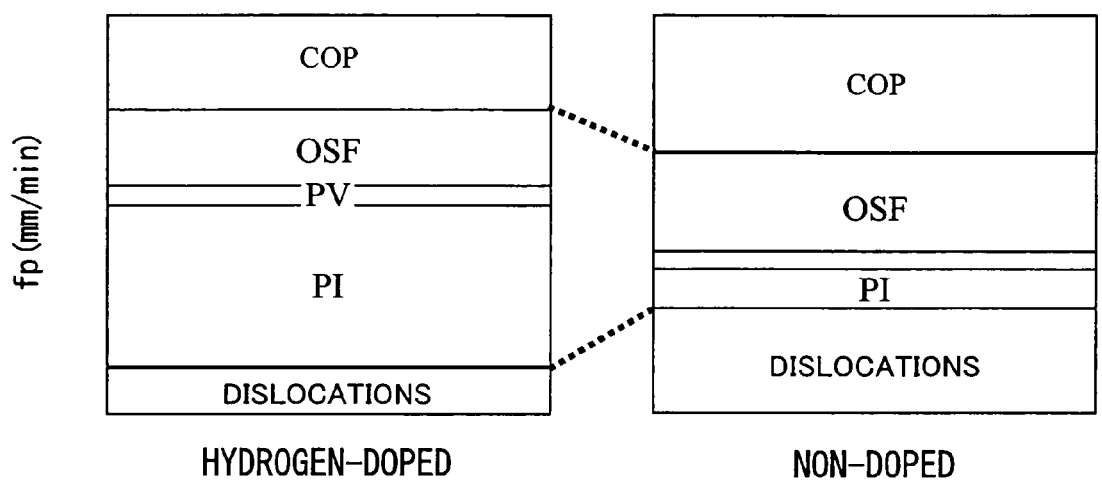
FIG. 10 is a schematic showing changes in the ranges of pull rate due to pulling in a hydrogen-containing atmosphere.

That is, in the grown-in defect-free single crystal composed of an oxygen precipitation accelerating region which is a vacancy-type grown-in defect-free region (PV region) and an interstitial type grown-in defect-free region (PI region) represented by E'-C' in FIG. 4, in the present embodiment, the range of the pull rate for the interstitial rich region so as to pull grown-in defect-free single crystals composed entirely of a PI region represented by F'-C' is made to expand. Specifically, as shown in FIG. 10, the margin for the PI region in this case becomes at least 4.5 times wider than the margin for the PI region in the case in which the pulling atmosphere contains no hydrogen.

By carrying out pull experiments like that just described, the relationship between the V/G ratio for various defect regions (e.g., COP region, OSF ring region, V-type grown-in defect-free region (PV region), I-type grown-in defect-free region (PI region), and dislocation cluster region) and the hydrogen concentration (FIG. 8) can be determined.

Moreover, by carrying out such experiments on conditions that the changing of the pull rate is conducted in several different positions, such as from 300 mm to 600 mm, from 500 mm to 800 mm, and from 700 mm to 1000 mm, the relationship between the range (margin) of the pull rate for obtaining a grown-in defect-free crystal and the axial position on the crystal (FIG. 9) can be determined. The operating conditions for obtaining a grown-in defect-free single crystal can be selected from FIG. 9.

Next, methods for preparing various wafers are described.

Figure 9:
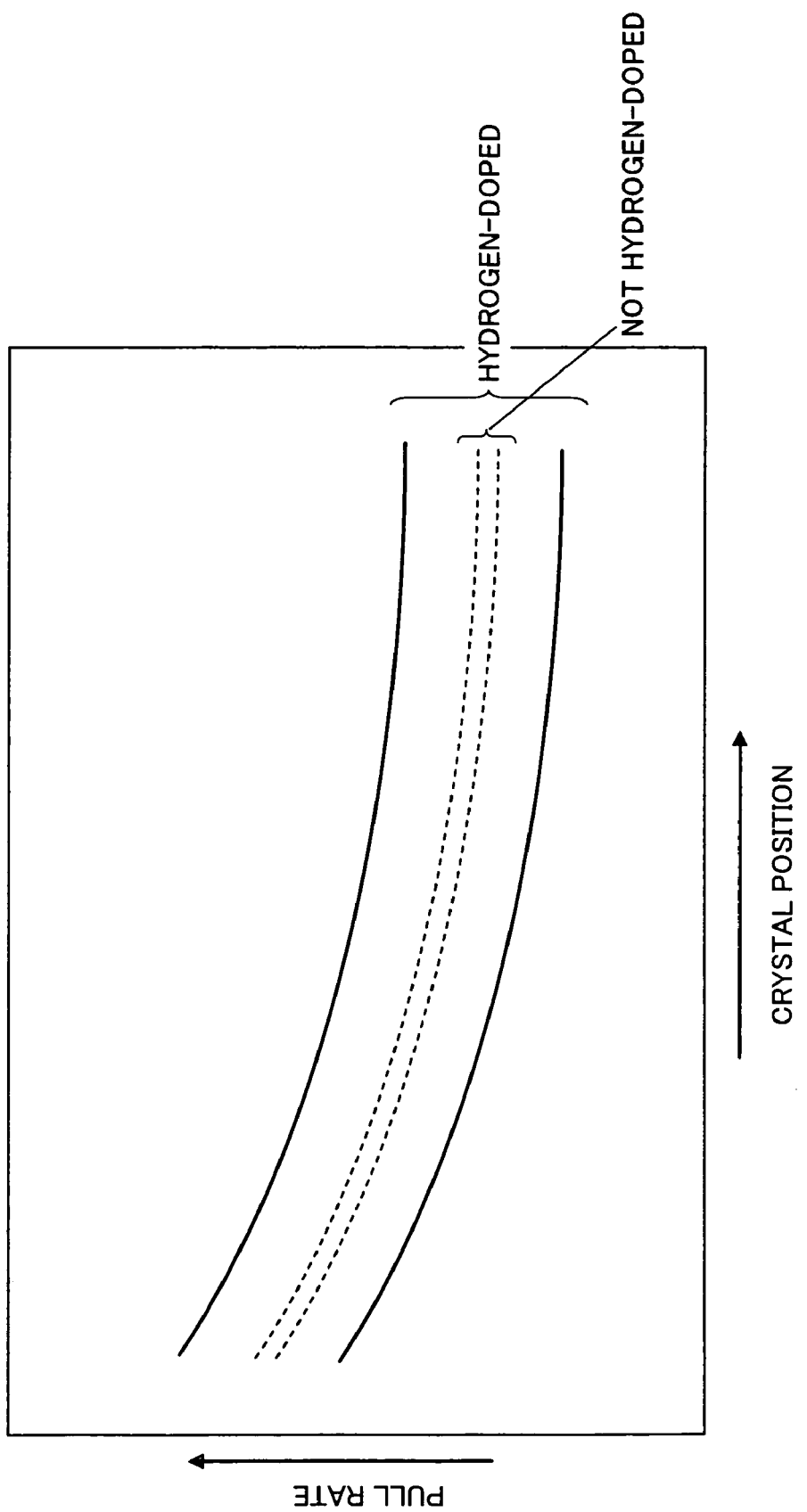
FIG. 9 is a graph showing the relationship between the crystal position and the range (margin) of the pull rate at which a grown-in defect-free region can be obtained.

By setting the pull rate within the range of the pull rate indicated by the solid lines in FIG. 9 at the corresponding crystal positions, a crystal can be grown which is completely free of grown-in defects from top to bottom.

Moreover, as shown in FIG. 9, by pulling the crystal in a hydrogen-containing atmosphere, the range (margin) of the pull rate for obtaining a grown-in defect-free crystal expands substantially (solid lines) from the prior-art range for crystal growth in an atmosphere without hydrogen (dashed lines), thus greatly improving the product yield of grown-in defect-free crystals.

In the case in which the pull rate is set to a rate that is at least the upper limit value represented by the solid lines in FIG. 9 but less than 1.7 times as high as the upper limit value, although the crystal will not be completely free of grown-in defects, a crystal containing COPs of 0.1 μm or less in size can be grown. If such a crystal is annealed in an atmosphere of hydrogen or argon, for example, the near-surface region to a depth of at least 1 μm can be rendered free of grown-in defects. Moreover, because the defects in the as-pulled crystal are 0.1 μm or less, the COPs can be made to disappear completely in the region from the surface layer to a depth of about 1 μm by an annealing at 1110° C. for about 2 hours. Such wafers can be used in this state as conventional polished wafers (PW) for device fabrication, and can also be used as silicon-on-insulator (SOI) substrates.

In the practice of the present invention, when a silicon single crystal is pulled in a hydrogen atmosphere by the Czochralski method, it is immaterial whether a magnetic field is applied to the melt. Hence, the magnetic Czochralski (MCZ) method in which a magnetic field is applied is also included in the examples of the method of the present invention.

After a silicon single crystal ingot containing the desired concentrations of hydrogen and oxygen has been obtained by the CZ method, the ingot undergoes conventional processing in which it is sliced into wafers with a cutter such as an internal diameter (ID) saw or a wire saw. The sliced wafers then pass through such operations as edge grinding, lapping, etching and polishing, and are thereby rendered into finished silicon single-crystal wafers. In addition to these operations, various other operations such as cleaning may also be carried out. Suitable changes in these processing operations, such as changes in the order of the operations or the omission of particular operations, may be carried out as appropriate for the intended purpose.

In the present embodiment of the present invention, by pulling a silicon single crystal in a hydrogen-containing inert gas atmosphere, the range of the pull rate for the PI region at which a single crystal of an interstitial rich region (PI region) that contains no COPs or dislocation clusters throughout the radial direction of the crystal can be pulled is enlarged at least two-fold, and preferably at least four-fold. By pulling the silicon single crystal under these conditions, all of the single crystal body is made to be an interstitial rich region (PI region). Compared with the prior art, in which it has been necessary to set the pull rate for the PI region when pulling a grown-in defect-free single crystal within a very narrow range, the range of the pull rate for the PI region in this embodiment is significantly expanded, making it possible to very easily produce grown-in defect-free single crystals at a higher pull rate than that in the prior art.

EXAMPLES

To verify the advantageous effects of the present invention, crystals were pulled under conditions that the pull rate was varied in a V-shaped manner and an apparatus for growing silicon single crystals with a 16-inch quartz crucible capable of growing a 6-inch crystal was used. The distribution of grown-in defects was evaluated.

The pull rate was varied, in terms of the ratio to the maximum pull rate, from 0.7 to 0.35 to 0.7. The hydrogen concentrations and pressures within the furnace during pulling were set respectively to (a) 0% and 4.0 kPa (30 torr), (b) 6% and 4.0 kPa (30 torr), and (c) 6% and 9.3 kPa (70 torr). Each of the resulting pulled crystals was vertically sectioned along the crystal axis, and the defect distribution within the resulting section was examined.

Figure 11:
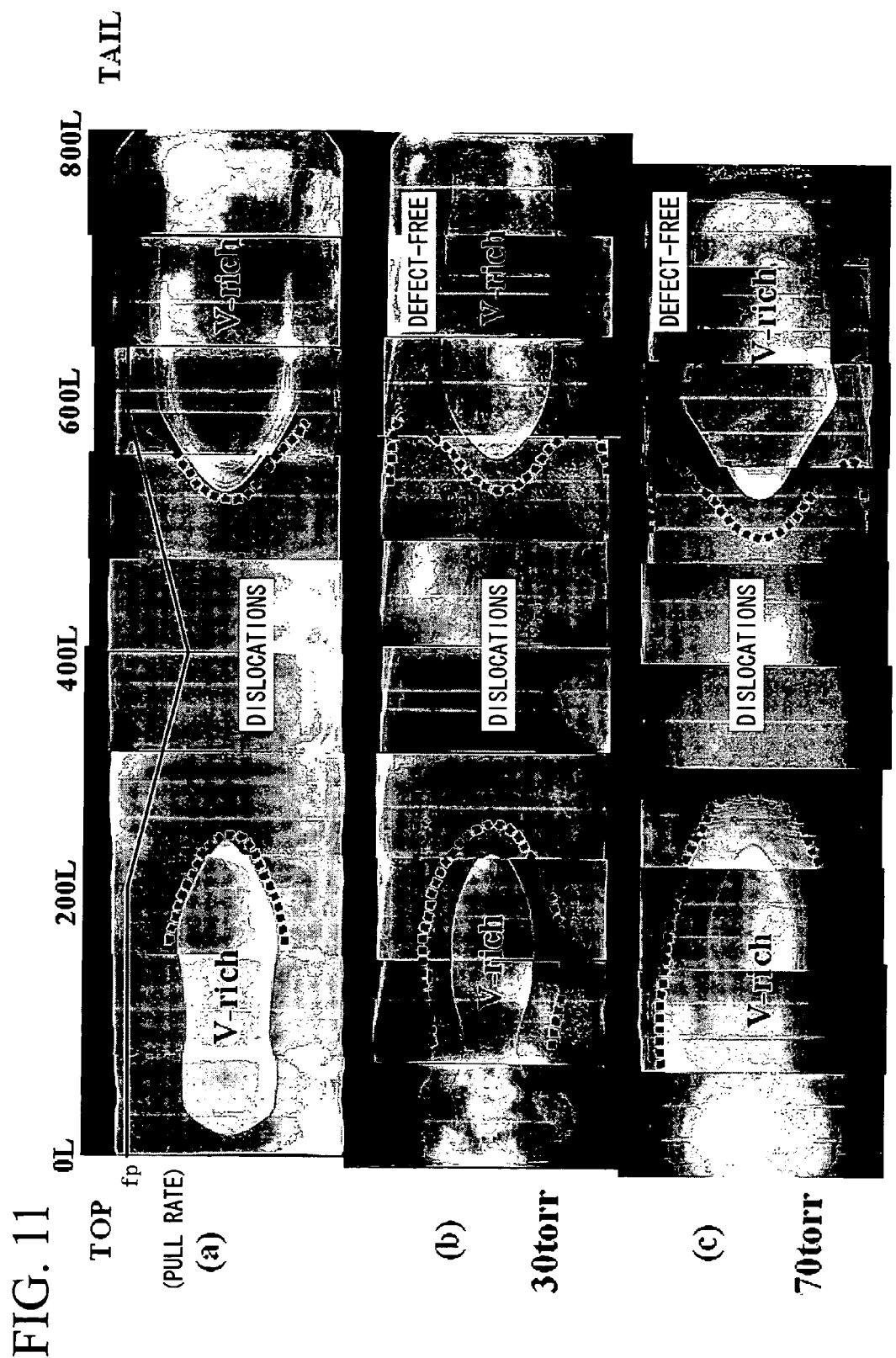
FIG. 11 shows sectional photographs of single crystals in a V-type pull test to verify changes in each crystal region with pulling in a hydrogen atmosphere.

The results are shown in FIG. 11. The sectioned surfaces were treated as follows.

The single crystals that have been grown in this way under different hydrogen concentrations were vertically sectioned along the pull axis so as to fabricate plate-like test pieces containing a region near the pull axis. Copper decoration was then carried out in order to examine the distribution of grown-in defects. First, each test piece was immersed in an aqueous copper sulfate solution, then air dried and subsequently heat treated in a nitrogen ambient at 900° C. for about 20 minutes. Next, in order to remove the copper silicide layer at the surface of the test piece, the test piece was immersed in a HF/HNO$_3$ mixed solution and several tens of microns of material at the surface layer was etched away. The position of the OSF ring and the distribution of the various defect regions were then examined by x-ray topography.

Figure 8:
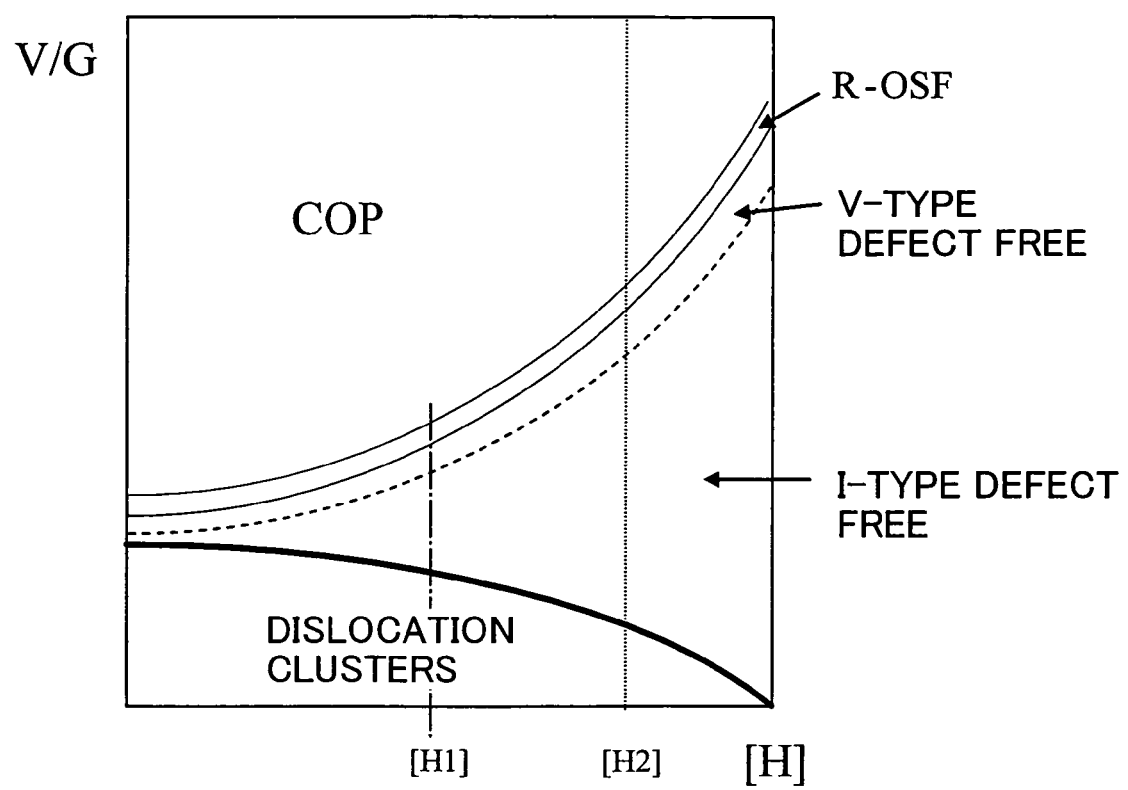
FIG. 8 is a graph illustrating the various defect forming regions in terms of the relationship between V/G and hydrogen concentration. The diagram shows expansion of the V/G range for defect formation due to pulling in a hydrogen-containing atmosphere.

The degree to which each region corresponding to FIG. 8 and the pull rates at this time changed when the crystal was pulled in a hydrogen-containing atmosphere are shown in FIG. 10 and Table 1. The margins of the pull rate for the respective defect regions in Table 1 were determined by measuring the width of each defect region as seen in the axial direction at the center of the crystal.

TABLE 1

| | | | Margin (mm/min) of the pull rate for each region | | |
|---|---|---|---|---|---|
| | Hydrogen concentration | Pressure in furnace | PI region | PV region | R-OSF region |
| Non-doped | — | 30 torr | 0.009 | 0.005 | 0.024 |
| Hydrogen atmosphere | 6% | 30 torr | 0.040 | 0.006 | 0.018 |
| | 6% | 70 torr | 0.063 | 0.006 | 0.020 |

From the results shown in FIG. 10 and Table 1, the margins of the pull rate for the PV region and the ring-like OSF region did not change much by pulling in a hydrogen-containing atmosphere. However, compared to pulling in an atmosphere without hydrogen, the margin of the pull rate for the PI region increased about 4.4-fold at a furnace pressure of 30 torr and increased about 7-fold at a furnace pressure of 70 torr when pulled in a hydrogen atmosphere. This shows that the width of the PI region clearly increases in a manner dependent on the hydrogen partial pressure.

INDUSTRIAL APPLICABILITY

The present invention can expand the range of the pull rate for pulling grown-in defect-free single crystals, enabling such crystals to be grown with great ease and at a higher pull rate than that in the prior art. The present invention is particularly well-suited to the preparation of grown-in defect-free wafers.

Figure 12:
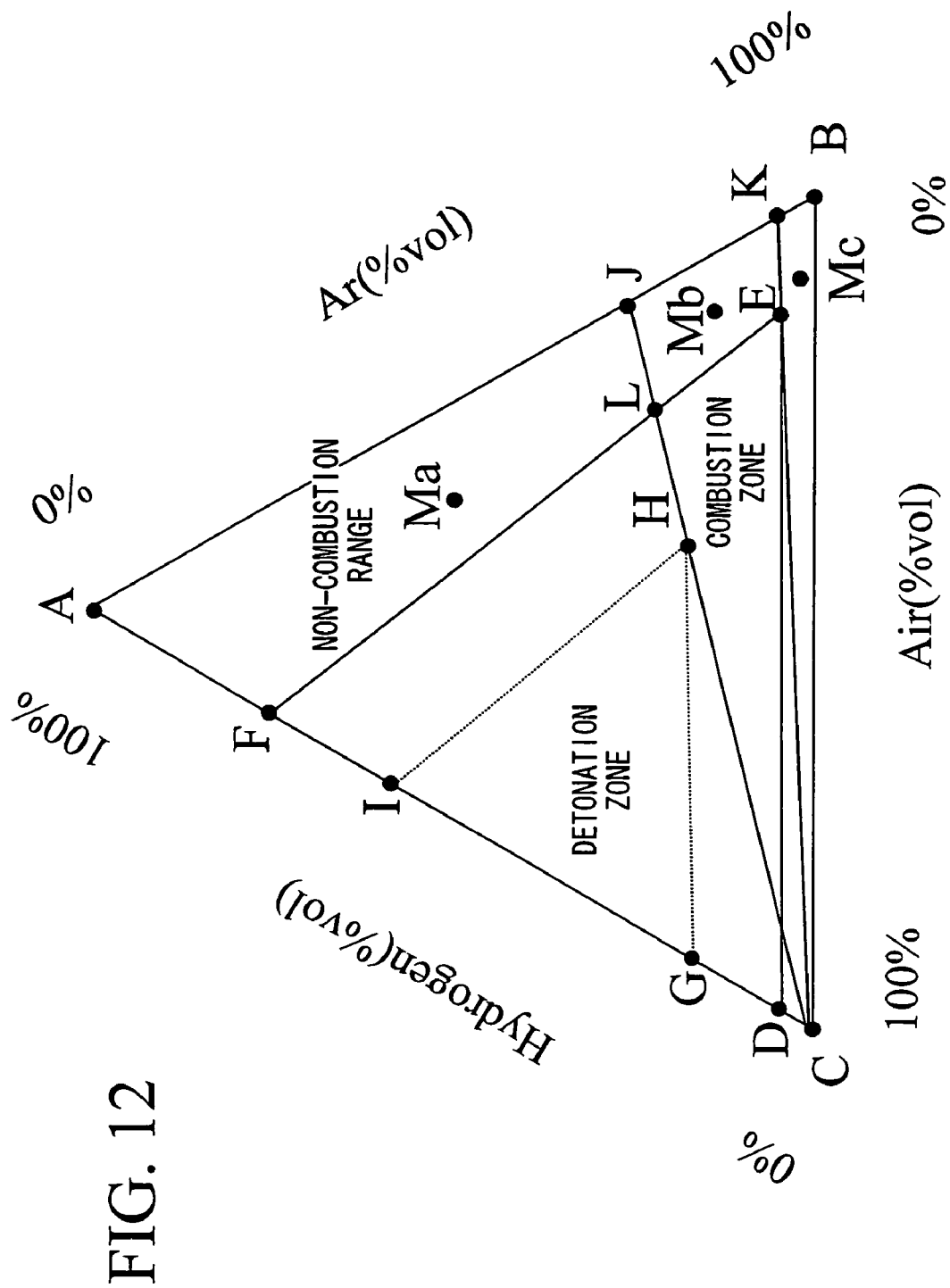
FIG. 12 is a triangular composition diagram showing the combustion and detonation concentration ranges in a three-component system depicting the hydrogen concentration VH (vol %), air concentration VAir (vol %) and argon concentration VAr (vol %).

The invention claimed is:

1. A method for growing silicon single crystals, the method comprising:
    pulling a silicon single crystal by the CZ method in a hydrogen-containing inert gas atmosphere so as to expand the range of the pull rate for the PI region at which a single crystal containing no COPs or dislocation clusters throughout the crystal in the radial direction thereof and having an interstitial rich region can be pulled,
    wherein the pulling of the silicon single crystal is conducted at a pull rate within this expanded range of the pull rate for the PI region so as to grow a grown-in defect-free silicon single crystal having a body portion that is an interstitial rich region, and
    the composition of the hydrogen-containing inert gas atmosphere is set so that the hydrogen concentration VH (vol %), air concentration VAir (vol %) and argon concentration VAr (vol %), when indicated as points (VH, VAr, VAir) in appended FIG. 12, are values which lie within a non-combustion range-enclosed by point A (100, 0, 0), point B (0, 100, 0), point C (0, 0, 100), point D (4, 0, 96), point B (4, 84, 12) and point F (75, 0, 25).

2. The method for growing silicon single crystals according to claim 1, wherein the range of the pull rate for the PI region in a hydrogen-containing inert gas atmosphere is expanded to at least twice the range in an inert gas atmosphere which contains no hydrogen.

3. The method for growing silicon single crystals according to claim 1, wherein a plurality of single crystals are pulled at a pull rate within the range of the pull rate for the PI region.

4. A method for manufacturing silicon wafers, the method comprising: slicing wafers from a single crystal grown by the method for growing silicon single crystals of claim 1.

5. The method for manufacturing silicon wafers according to claim 4, wherein the method further comprises an annealing treatment.

* * * * *